(12) United States Patent
Yokoyama et al.

(10) Patent No.: US 11,626,353 B2
(45) Date of Patent: Apr. 11, 2023

(54) METHOD OF MANUFACTURING SEMICONDUCTOR DEVICE AND SEMICONDUCTOR DEVICE

(71) Applicant: Mitsubishi Electric Corporation, Tokyo (JP)

(72) Inventors: Shuhei Yokoyama, Tokyo (JP); Hiroyuki Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 17/367,834

(22) Filed: Jul. 6, 2021

(65) Prior Publication Data

US 2022/0102250 A1 Mar. 31, 2022

(30) Foreign Application Priority Data

Sep. 29, 2020 (JP) .............................. JP2020-162845

(51) Int. Cl.
| | | |
|---|---|---|
| *H01L 23/495* | (2006.01) | |
| *H01L 25/16* | (2006.01) | |
| *H01L 21/48* | (2006.01) | |
| *H01L 23/00* | (2006.01) | |

(52) U.S. Cl.
CPC .... *H01L 23/49575* (2013.01); *H01L 21/4842* (2013.01); *H01L 23/49562* (2013.01); *H01L 23/49565* (2013.01); *H01L 25/16* (2013.01); *H01L 24/48* (2013.01); *H01L 2224/48137* (2013.01); *H01L 2224/48175* (2013.01)

(58) Field of Classification Search
CPC .......... H01L 23/49575; H01L 21/4842; H01L 23/49562; H01L 23/49565; H01L 25/16; H01L 24/48; H01L 2224/48137; H01L 2224/48175; H01L 23/49551; H01L 2224/48111; H01L 2924/00014; H01L 23/49541; H01L 2224/48247; H01L 2224/49171; H01L 2924/181
See application file for complete search history.

(56) References Cited

FOREIGN PATENT DOCUMENTS

JP 2014-93303 A 5/2014

*Primary Examiner* — Robert G Bachner
(74) *Attorney, Agent, or Firm* — Studebaker & Brackett PC

(57) ABSTRACT

According to the present disclosure, a method of manufacturing a semiconductor device includes the steps of (a) preparing a lead frame including a switching element die pad, a control element die pad, and a third-side side rail portion, (b) mounting a switching element and a diode element on the switching element die pad and mounting a control element configured to control the switching element on the control element die pad, (c) sealing the switching element, the diode element, and the control element with a mold resin such that the power side terminal, the control side terminal, and a part of the third-side side rail portion protrude outward, and (d) forming a third-side side rail terminal by cutting the third-side side rail portion, the third-side side rail terminal extending from a part of the third-side side rail portion.

7 Claims, 20 Drawing Sheets

F I G. 1 0
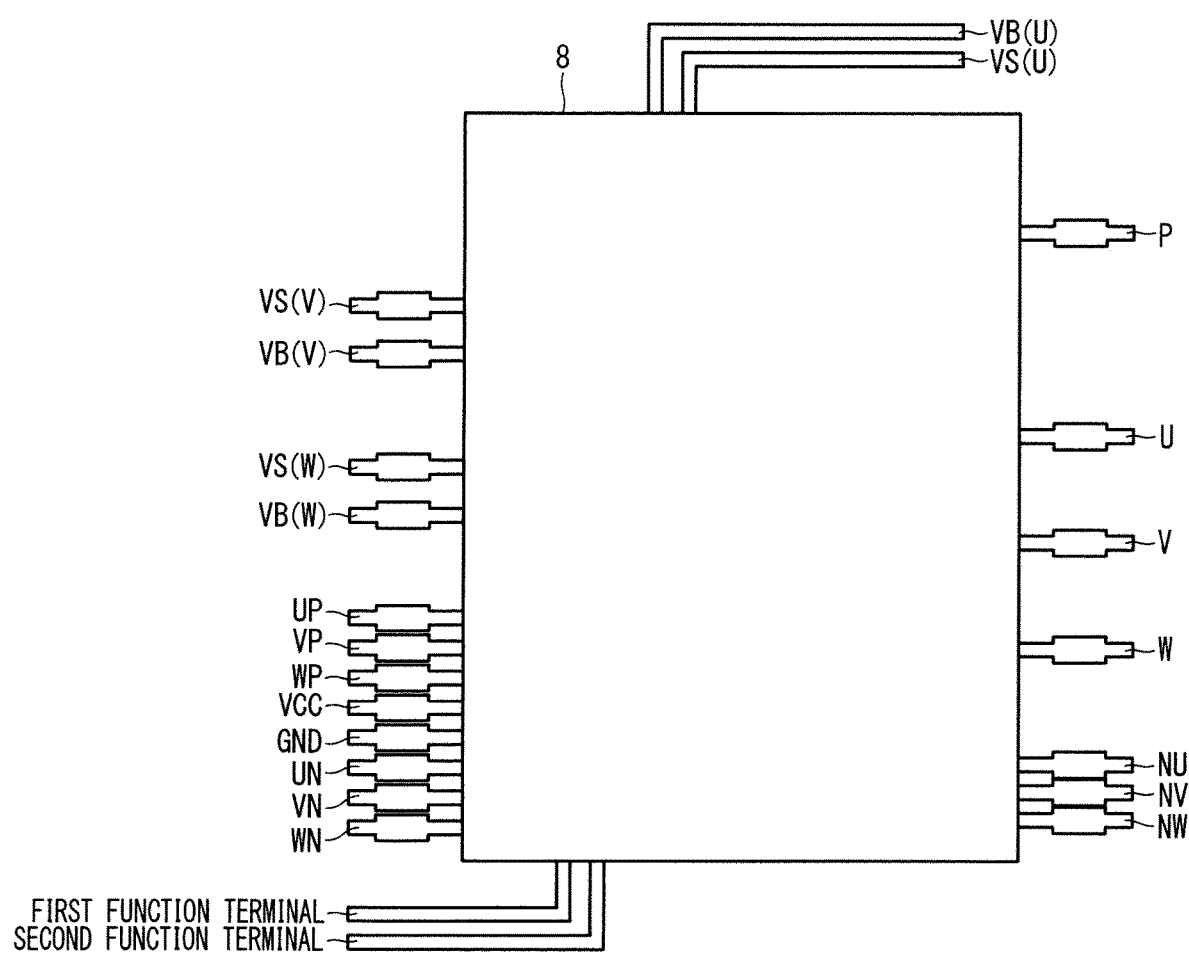

F I G. 1 3
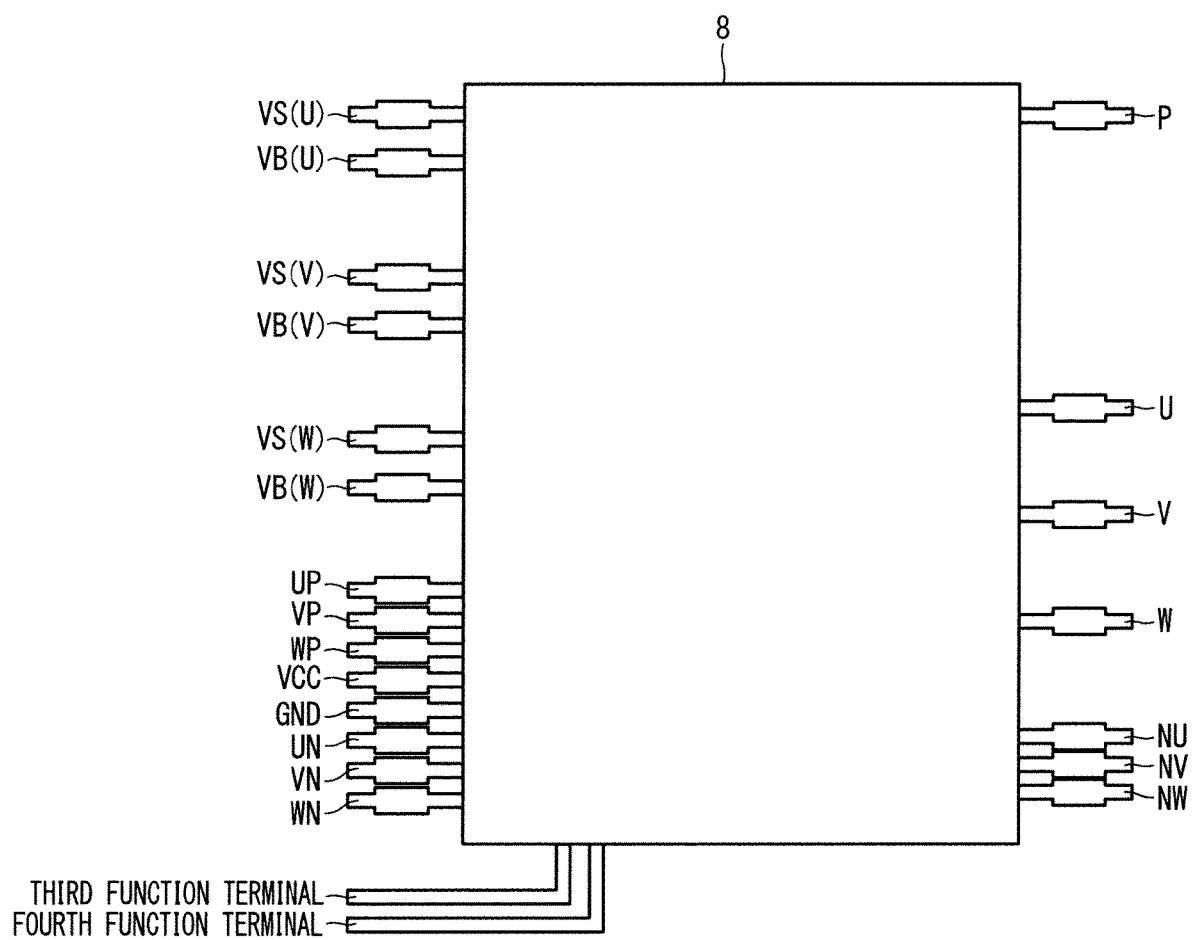

F I G. 1 8
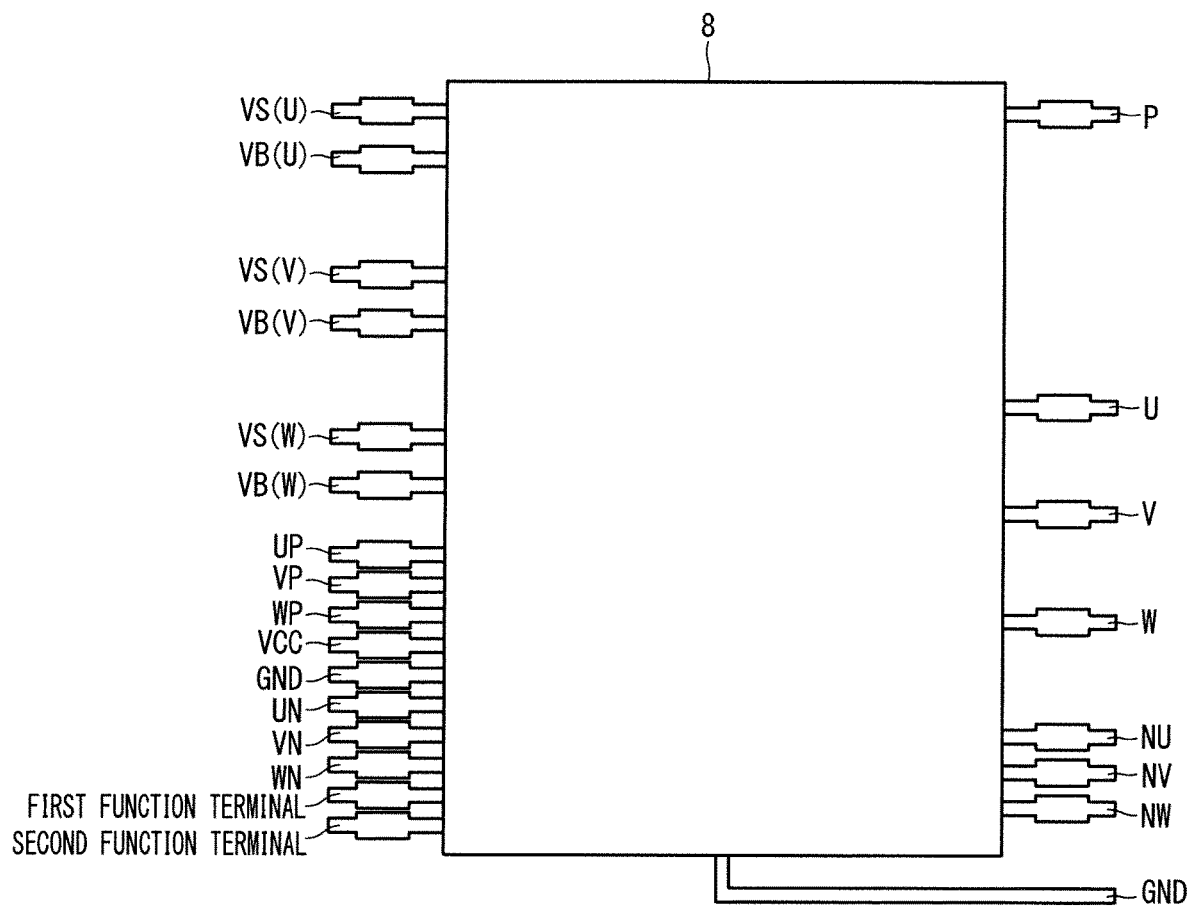

METHOD OF MANUFACTURING SEMICONDUCTOR DEVICE AND SEMICONDUCTOR DEVICE

BACKGROUND OF THE INVENTION

Field of the Invention

The present disclosure relates to a method of manufacturing a semiconductor device and a semiconductor device.

Description of the Background Art

Conventionally, a semiconductor device including lead terminals extending outward from each of the four side surfaces of a lead frame has been disclosed (see, for example, Japanese Patent Application Laid-Open No. 2014-93303).

In Japanese Patent Application Laid-Open No. 2014-93303, the mold resin portion can be miniaturized as compared with the configuration in which the lead terminals extending outward from only two opposite side surfaces of the four side surfaces of the lead frame are provided. However, in the configuration, the lead terminals also extend outward from the side surfaces other than the two opposite side surfaces, making the size of the lead frame large. Therefore, there has been a problem that the manufacturing cost of the semiconductor devices increases because of the reduced number of semiconductor devices that can be collectively produced due to the reduced number of semiconductor devices that can be provided in one lead frame.

SUMMARY

An object of the present disclosure is to provide a method of manufacturing a semiconductor device and a semiconductor device capable of reducing the manufacturing cost.

According to the present disclosure, the method of manufacturing the semiconductor device includes the steps of (a) preparing a lead frame including a switching element die pad connected to a power side terminal arranged on a side of a first side in plan view, a control element die pad connected to a control side terminal arranged on a side of a second side opposite to the first side, and a third-side side rail portion provided on a side of a third side different from the first side and the second side, (b) mounting a switching element and a diode element on the switching element die pad and mounting a control element configured to control the switching element on the control element die pad, (c) sealing the switching element, the diode element, and the control element with a mold resin such that the power side terminal, the control side terminal, and a part of the third-side side rail portion protrude outward, and (d) forming a third-side side rail terminal by cutting the third-side side rail portion, the third-side side rail terminal extending from a part of the third-side side rail portion.

According to the present disclosure, a method of manufacturing a semiconductor device includes forming a third-side side rail terminal by cutting the third-side side rail portion, the third-side side rail terminal extending from a part of the third-side side rail portion; therefore, reduction of manufacturing cost is ensured.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a plan view illustrating an appearance example of the semiconductor device according to Embodiment 2;

FIG. 13 is a plan view illustrating an appearance example of a semiconductor device according to Embodiment 3;

FIG. 18 is a plan view illustrating an appearance example of a semiconductor device according to Embodiment 5;

DESCRIPTION OF THE PREFERRED EMBODIMENTS

Embodiment 1

Figure 1:
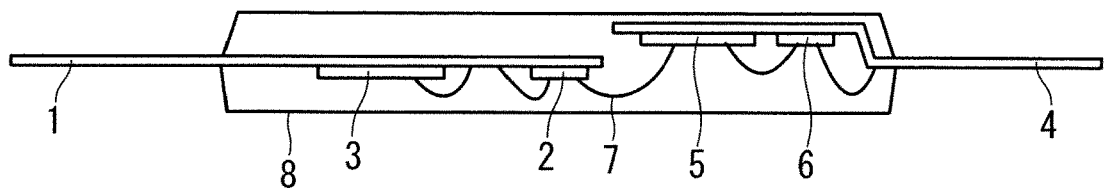
FIG. 1 is a cross-sectional view illustrating a configuration example of a semiconductor device according to Embodiment 1.
Figure 2:
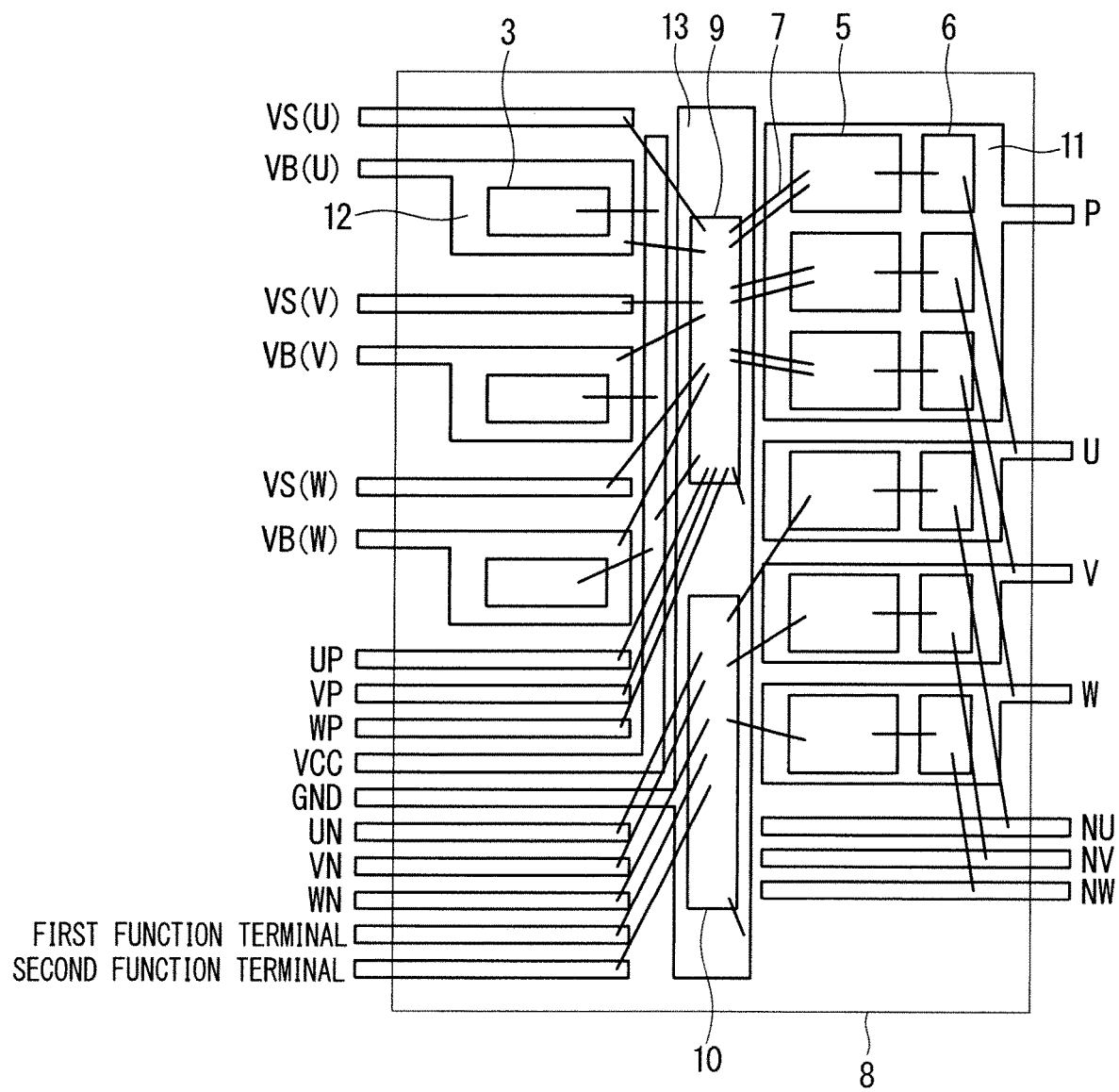
FIG. 2 is a plan view illustrating the configuration example of the semiconductor device according to Embodiment 1.
Figure 3:
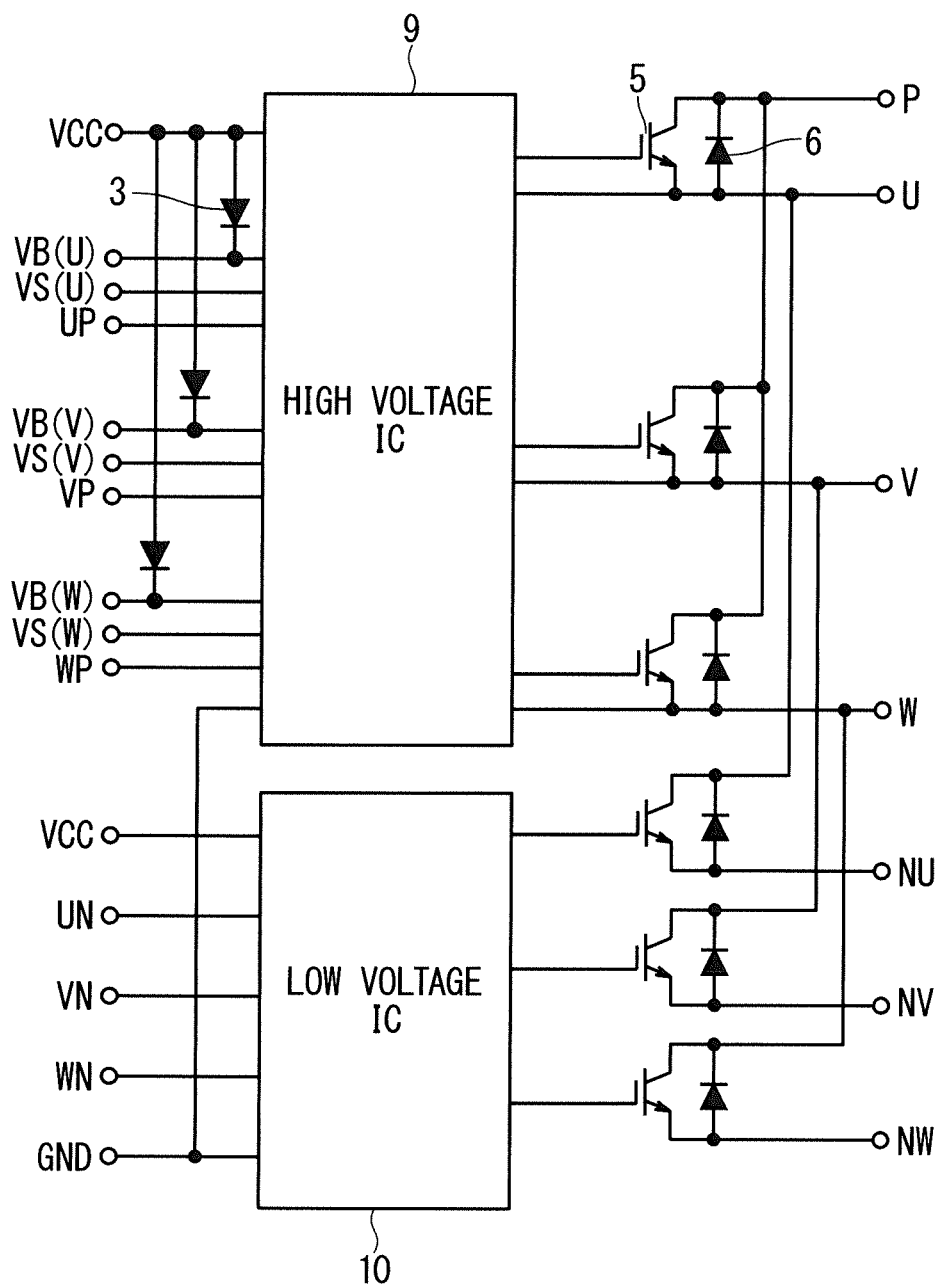
FIG. 3 is a circuit diagram illustrating the configuration example of the semiconductor device according to Embodiment 1.

FIG. 1 is a cross-sectional view illustrating a configuration example of a semiconductor device according to Embodiment 1. FIG. 2 is a plan view illustrating the configuration example of the semiconductor device according to Embodiment 1. FIG. 3 is a circuit diagram illustrating the configuration example of the semiconductor device according to Embodiment 1.

As illustrated in FIGS. 1 to 3, the semiconductor device includes power chips 5 being switching elements, Freewheel diodes 6 being diode elements, an IC 2 (a high voltage IC 9, a low voltage IC 10) being a control element controlling the power chips 5, and bootstrap diodes 3. As illustrated in FIG. 2, six power chips 5, six freewheel diodes 6, and three bootstrap diodes 3 are provided in the vertical direction of the paper sheet, respectively.

The power chips 5 and the freewheel diodes 6 are mounted on a power chip die pad 11, and power side terminals 4 are connected to the power chip die pad 11. The power side terminals 4 include a P terminal, a U terminal, a V terminal, a W terminal, an NU terminal, an NV terminal, and an NW terminal.

The IC 2 is mounted on an IC die pad 13, the bootstrap diodes 3 are mounted on a control element die pad 12, and control side terminals 1 are connected to each of the IC die pad 13 and the control element die pad 12. The control side terminals 1 include a VS (U) terminal, a VB (U) terminal, a VS (V) terminal, a VB (V) terminal, a VS (W) terminal, a VB (W) terminal, a UP terminal, a VP terminal, a WP terminal, a VCC terminal, a GND terminal, a UN terminal, a VN terminal, a WN terminal, a first function terminal, and second function terminal.

The power chips 5, the freewheel diodes 6, and the IC 2 are connected by wires 7. Also, the power chips 5, the freewheel diodes 6, the IC 2, and the bootstrap diodes 3 are sealed with a mold resin 8. The power side terminals 4 and the control side terminals 1 project outward from the opposite side surfaces of the mold resin 8. As described above, the semiconductor device according to Embodiment 1 is a power semiconductor device sealed with the mold resin 8 and used for large power applications.

Figure 4:
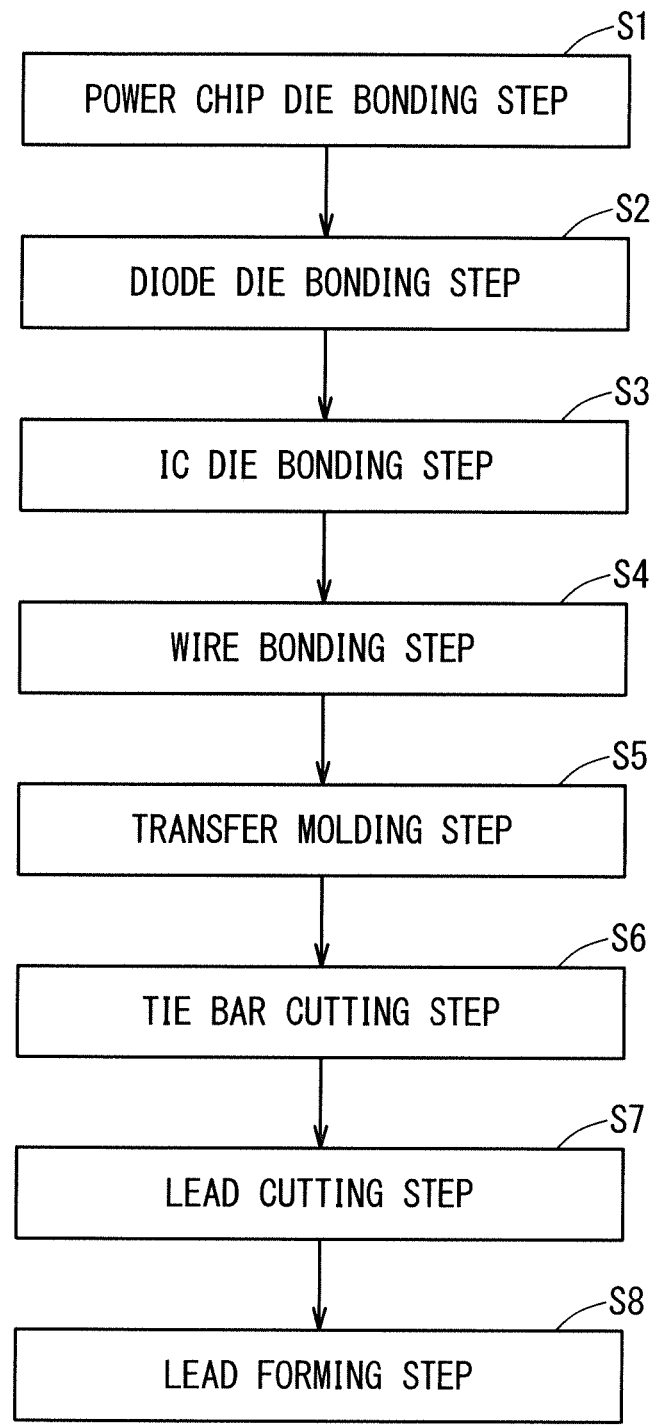
FIG. 4 is a flowchart illustrating an example of a manufacturing step of the semiconductor device according to Embodiment 1.

FIG. 4 is a flowchart illustrating an example of a manufacturing step of the semiconductor device according to Embodiment 1. The order of Step S1, Step S2, and Step S3 illustrated in FIG. 4 is not limited to the flowchart, and an arbitrary order may also be applicable.

Figure 5:
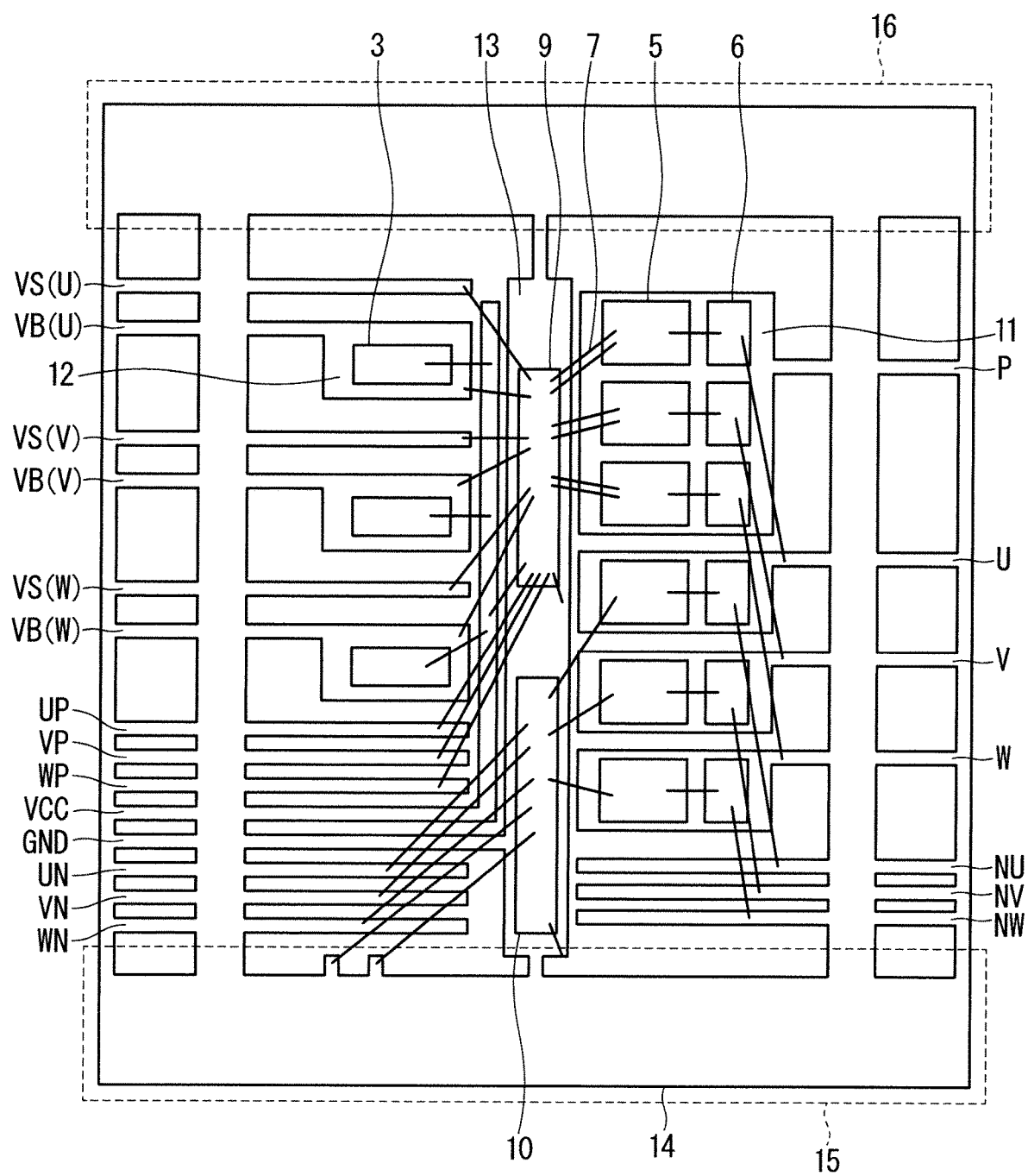
FIG. 5 is a plan view illustrating an example of a manufacturing step of the semiconductor device according to Embodiment 1.

In a power chip die bonding step of Step S1, as illustrated in FIG. 5, the power chips 5 are placed on the power chip die pad 11, and the power chips 5 and the power chip die pad 11 are electrically connected. The power chip die pad 11 is a part of a lead frame 14.

In a diode die bonding step of Step S2, as illustrated in FIG. 5, the freewheel diodes 6 are placed on the power chip die pad 11, and the freewheel diodes 6 and the power chip die pad 11 are electrically connected.

In an IC die bonding step of Step S3, as illustrated in FIG. 5, the high voltage IC 9 and the low voltage IC 10 are placed on the IC die pad 13, and the high voltage IC 9 and the low voltage IC 10 and the IC die pad 13 are electrically connected. The IC die pad 13 is a part of the lead frame 14.

A step of placing the bootstrap diodes 3 on the control element die pad 12 and electrically connecting the bootstrap diodes 3 and the control element die pad 12 may be performed in either Step S2 or Step S3.

In a wire bonding step of Step S4, as illustrated in FIG. 5, the power chips 5 and the freewheel diodes 6, the power chips 5 and the high voltage IC 9, the power chips 5 and the low voltage IC 10, the high voltage IC 9 and the bootstrap diodes 3 are electrically connected by the wires 7.

Figure 6:
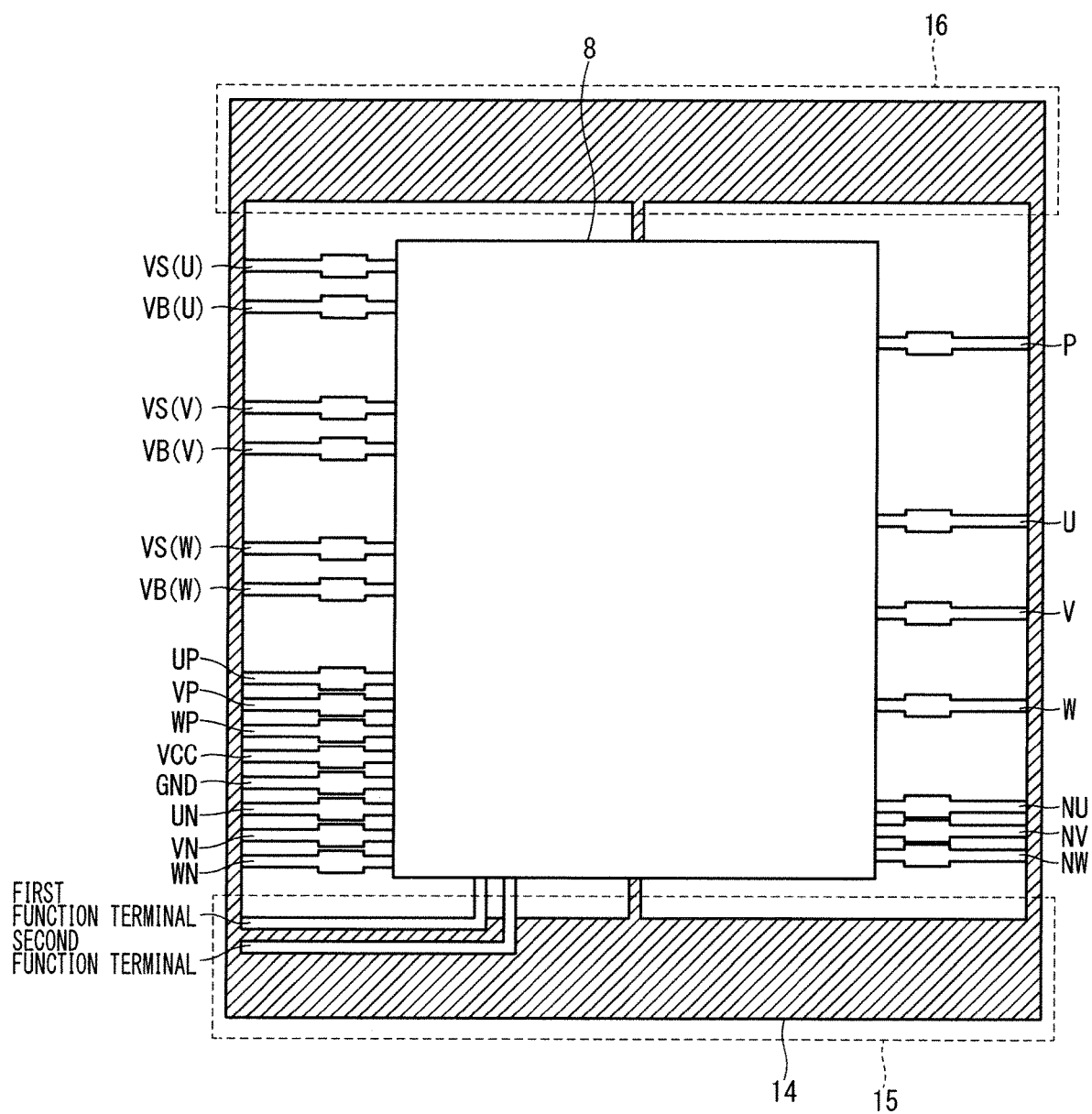
FIG. 6 is a plan view illustrating an example of a manufacturing step of the semiconductor device according to Embodiment 1.

In a transfer molding step of Step S5, as illustrated in FIG. 6, the power chips 5, the freewheel diodes 6, the high voltage IC 9, the low voltage IC 10, and the bootstrap diodes 3 are sealed with the mold resin 8 such that parts of the power side terminals 4, the control side terminals 1, and a side rail portion 15 (a third-side side rail portion provided on the third-side side different from the first side and the second side) protrude outward.

In a tie bar cutting step of Step S6, the tie bar connecting each terminal included in the power side terminals 4 and the tie bar connecting each terminal included in the control side terminals 1 are cut and removed. As a result, each terminal is separated. As illustrated in FIG. 5, the P terminal, the U terminal, the V terminal, the W terminal, the NU terminal, the NV terminal, and the NW terminal, being the power side terminals 4, are arranged on the first-side side of the lead frame 14. Also, the VS (U) terminal, the VB (U) terminal, the VS (V) terminal, the VB (V) terminal, the VS (W) terminal, the VB (W) terminal, the UP terminal, the VP terminal, the WP terminal, the VCC terminal, the GND terminal, the UN terminal, the VN terminal, the WN terminal, being the control side terminals 1 are arranged on the second-side side opposite to the first side. At this point, the first function terminal and the second function terminal are not arranged on the second-side side of the lead frame 14.

In a lead cutting step of Step S7, the outer peripheral portion of the lead frame 14 (the hatched portion in FIG. 6) is cut and removed. As a result, the first function terminal and the second function terminal are formed from the side rail portion 15. That is, the first function terminal and the second function terminal (third-side side rail terminals) are formed such that they extend from a part of the side rail portion 15 provided on the third-side side of the lead frame 14.

Figure 7:
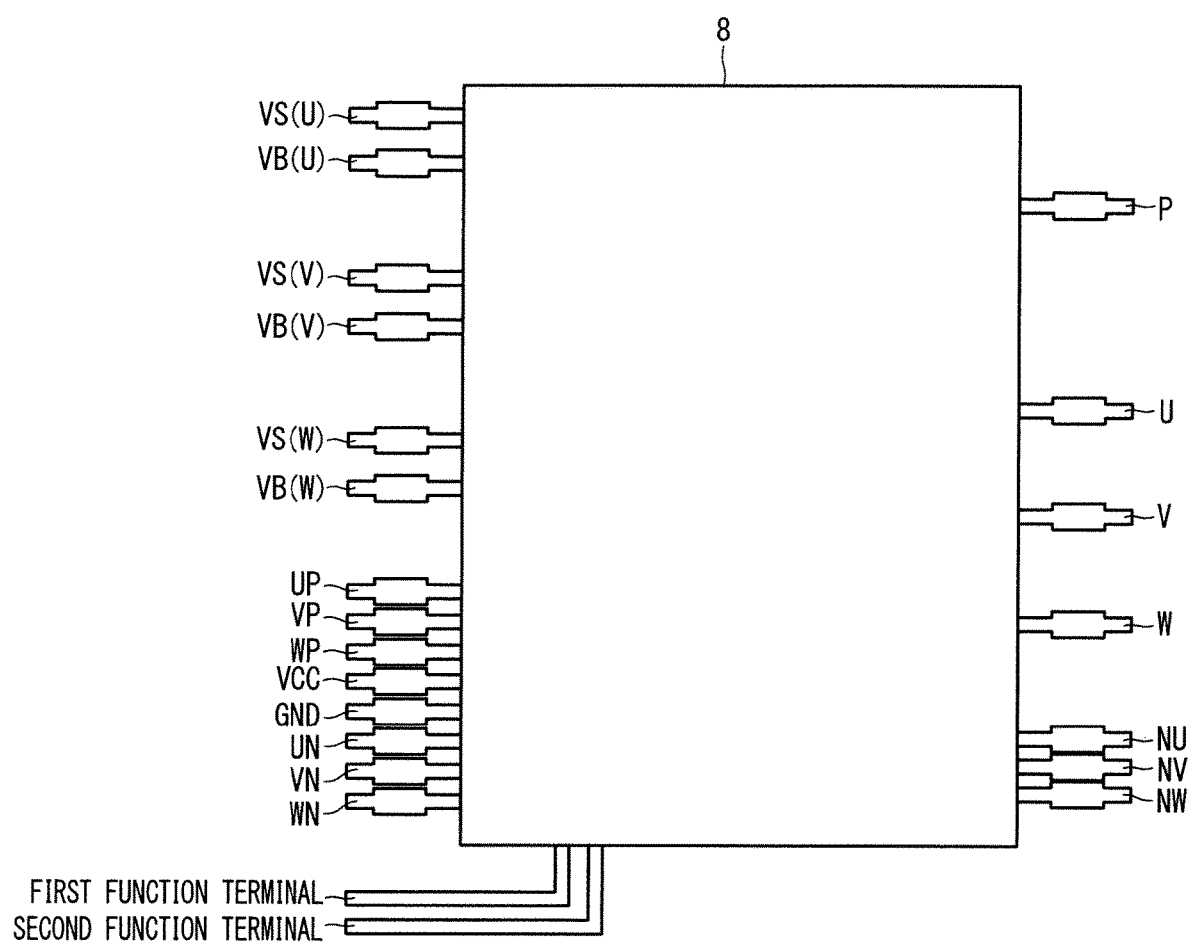
FIG. 7 is a plan view illustrating an appearance example of the semiconductor device according to Embodiment 1.
Figure 8:
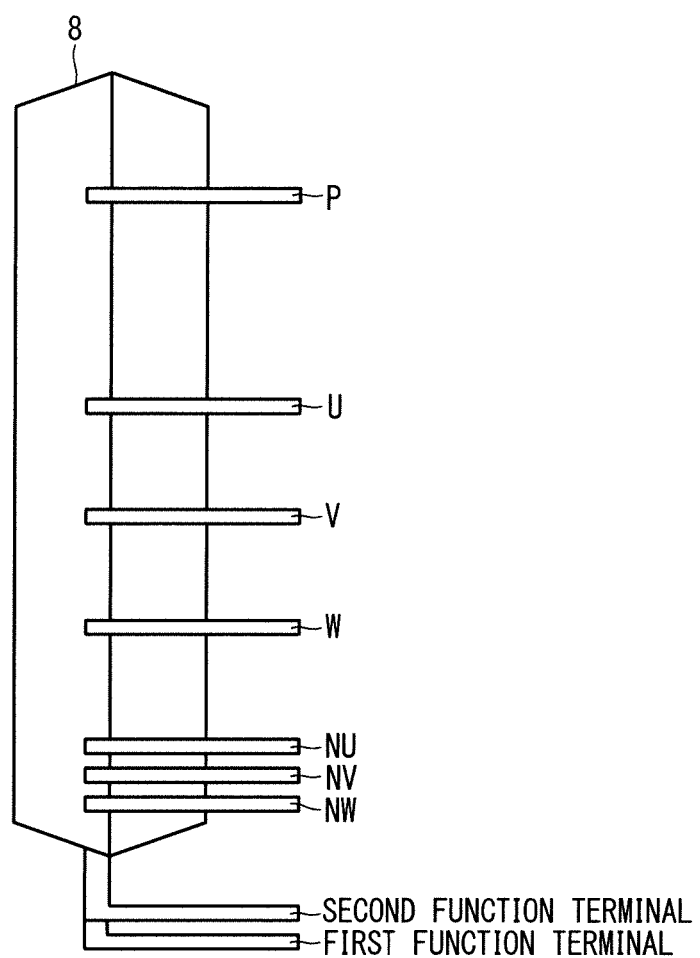
FIG. 8 is a side view illustrating the appearance example of the semiconductor device according to Embodiment 1.

In a lead forming step of Step S8, each terminal is formed into a desired shape by bending the power side terminals 4 and the control side terminals 1 as illustrated in FIGS. 7 and 8.

As described above, according to Embodiment 1, the first function terminal and the second function terminal, which have been conventionally arranged on the second-side side of the lead frame, are formed from the side rail portion 15 provided on the third-side side of the lead frame; therefore not only can the mold resin be miniaturized (that is, miniaturization of the semiconductor device), but also the size of the lead frame can be reduced. Therefore, the manufacturing cost of the semiconductor devices decreases because of the increased number of semiconductor devices that can be collectively produced due to the maintained number of semiconductor devices that can be provided in one lead frame.

Further, by forming the first function terminal and the second function terminal only in the side rail portion 15 of the lead frame 14, the terminals are prevented from rubbing and contacting each other when the completed semiconductor devices (products) are packed in a box (tube, etc.), ensuring the prevention of product destruction.

In the above description, although the configuration in which the first function terminal and the second function terminal are formed in the side rail portion 15 of the lead frame 14 has been described, the present invention is not limited thereto. Arbitrary types and the number of terminals formed in the side rail portion 15 and an arbitrary bending direction of the terminals may also be adopted. Further, the terminals may be formed from the side rail portion 16 instead of the side rail portion 15. In this case, the VS (U) terminal and the VB (U) terminal may be formed from the side rail portion 16, for example.

Embodiment 2

In Embodiment 1, the configuration in which the first function terminal and the second function terminal are formed in the side rail portion 15 of the lead frame 14 has been described. Embodiment 2 is characterized in that terminals are also formed in the side rail portion 16 of the lead frame 14. Other configurations and manufacturing steps are the same as Embodiment 1, and description thereof is omitted here.

Figure 9:
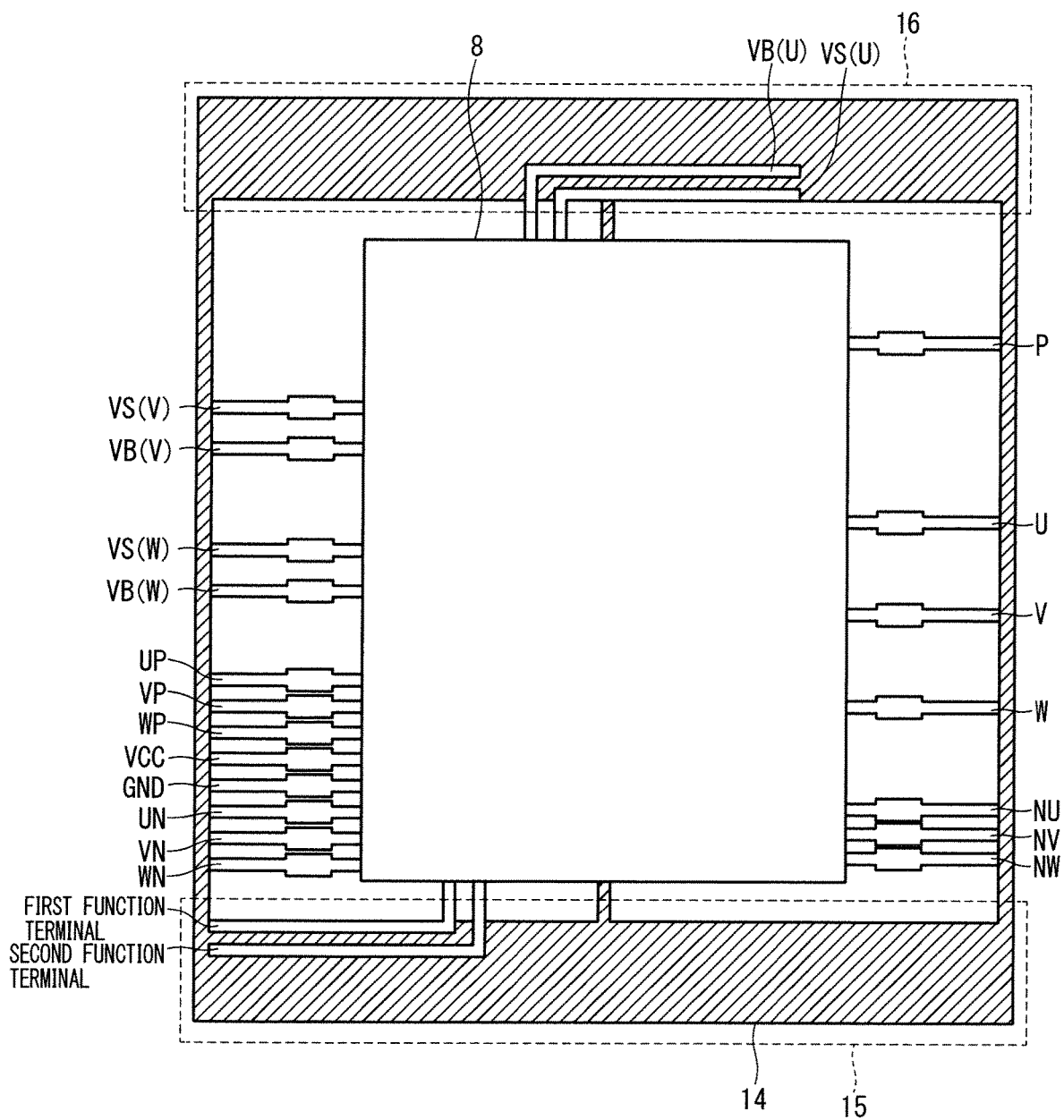
FIG. 9 is a plan view illustrating an example of a manufacturing step of a semiconductor device according to Embodiment 2.
Figure 11:
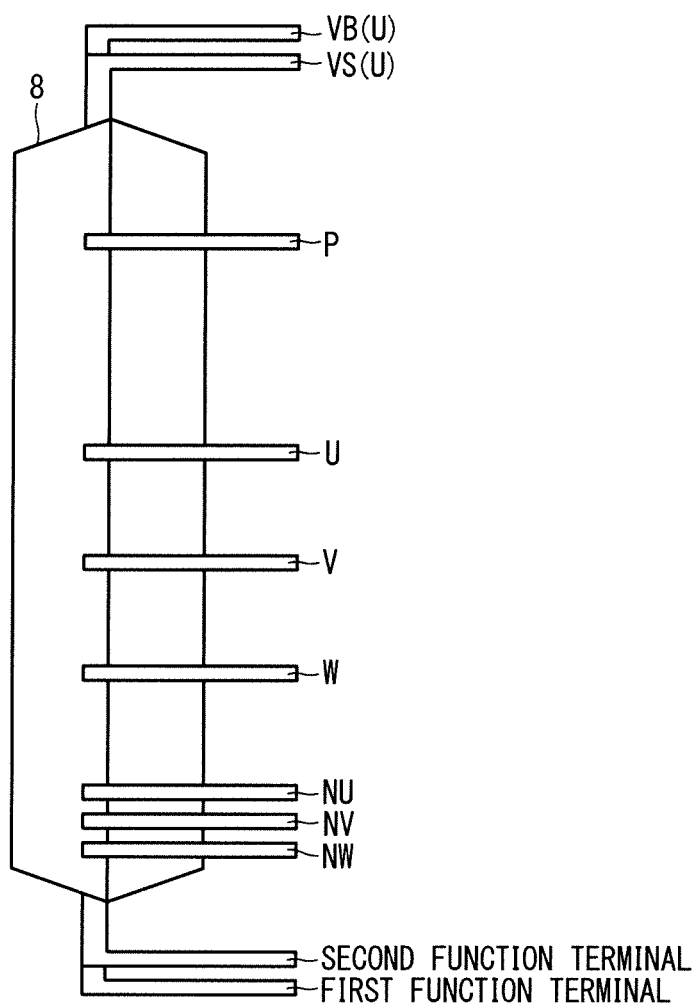
FIG. 11 is a side view illustrating an appearance example of the semiconductor device according to Embodiment 2.

FIG. 9 is a plan view illustrating an example of a manufacturing step of the semiconductor device according to Embodiment 2, and illustrates the semiconductor device after the tie bar cutting step of Step S6 illustrated in FIG. 6. FIG. 10 is a plan view illustrating an appearance example of the semiconductor device according to Embodiment 2. FIG. 11 is a side view illustrating the appearance example of the semiconductor device according to Embodiment 2.

In the lead cutting step of Step S7 illustrated in FIG. 6, the outer peripheral portion of the lead frame 14 (the hatched portion in FIG. 9) is cut and removed. As a result, a first function terminal and a second function terminal (third-side side rail terminals) are formed from the side rail portion 15 (third-side side rail terminal portion).

Further, a VS (U) terminal and a VB (U) terminal are formed from the side rail portion 16 (fourth-side side rail portion provided on the fourth-side side opposite to the third side). That is, the VS (U) terminal and the VB (U) terminal (fourth-side side rail terminals) are formed such that they extend from a part of the side rail portion 16 provided on the fourth-side side of the lead frame 14.

The positions where the first function terminal and the second function terminal provided on the third-side side protrude from the mold resin 8 and the positions where the VS (U) terminal and VB (U) terminal provided on the fourth-side side protrude from the mold resin 8 are not opposite to each other.

As described above, according to Embodiment 2, the first function terminal and the second function terminal, which have been conventionally arranged on the second-side side of the lead frame, are formed from the side rail portion 15 provided on the third-side side of the lead frame, and the VS (U) terminal and the VB (U) terminal are formed in the side rail portion 16 provided on the fourth-side side of the lead frame; therefore, compared to Embodiment 1, not only can the mold resin be more miniaturized (that is, miniaturization of the semiconductor device), but also the size of the lead frame can be more reduced. As a result, the manufacturing cost of the semiconductor device decreases more than that with Embodiment 1.

Figure 12:
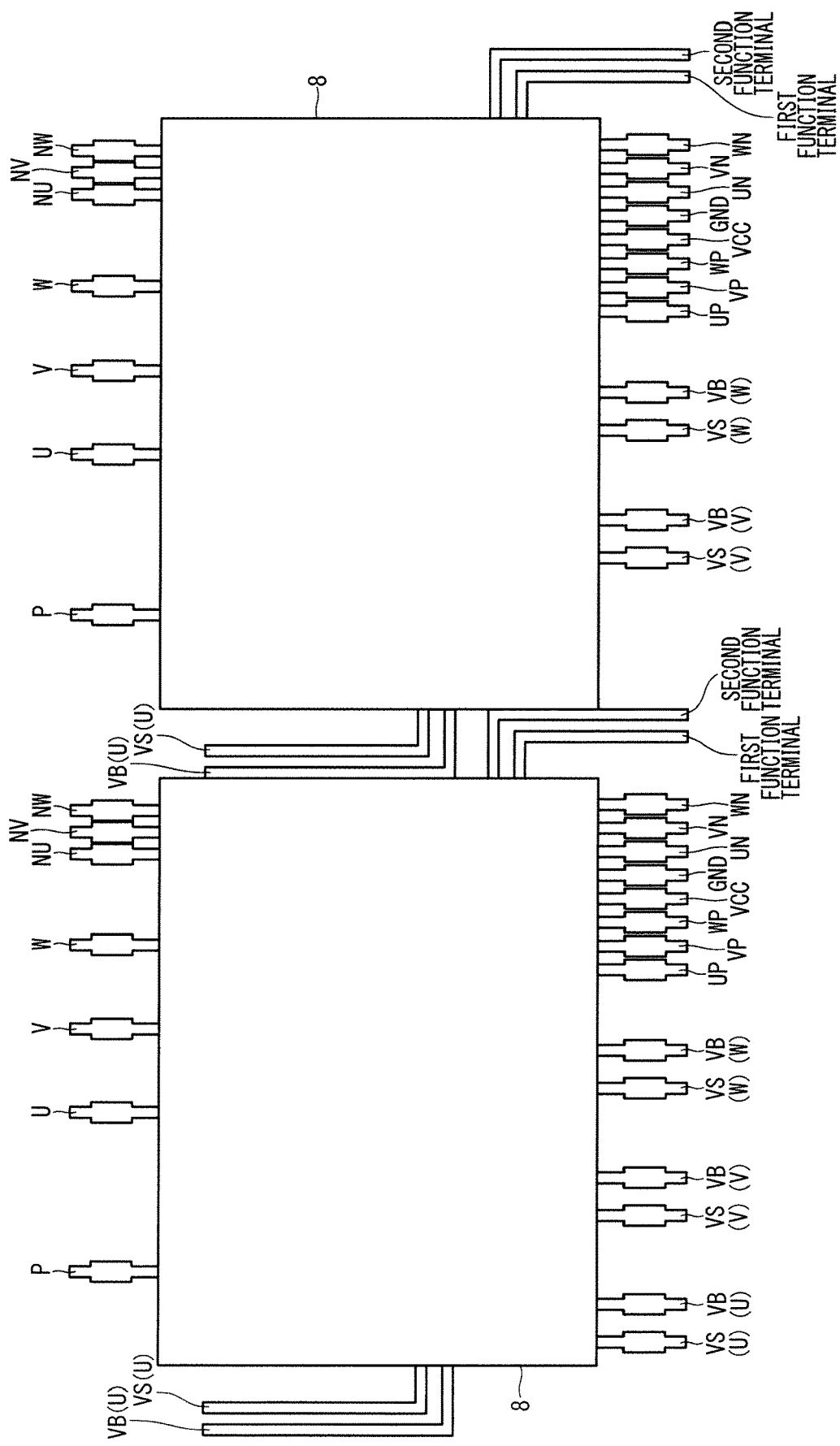
FIG. 12 is a plan view illustrating an appearance example of the semiconductor device according to Embodiment 2.

Also, the positions where the first function terminal and the second function terminal provided on the third-side side protrude from the mold resin 8 and the positions where the VS (U) terminal and VB (U) terminal provided on the fourth-side side protrude from the mold resin 8 are not opposite to each other. Consequently, as illustrated in FIG. 12, the terminals are prevented from rubbing and contacting each other when the completed semiconductor devices (products) are packed in a box (tube, etc.), ensuring the prevention of product destruction.

In the above description, although the configuration in which the first function terminal and the second function terminal are formed in the side rail portion 15 of the lead frame 14 and the VS (U) terminal and the VB (U) terminal are formed in the side rail portion 16 of the lead frame 14 has been described, the present invention is not limited thereto. Arbitrary types and number of terminals formed in each of the side rail portion 15 and the side rail portion 16 and an arbitrary bending direction of the terminals may also be adopted.

Embodiment 3

In Embodiment 1, the case has been described in which the first function terminal and the second function terminal for the existing functions conventionally arranged on the second-side side of the lead frame are formed from the side rail portion 15 provided on the third-side side of the lead frame. Embodiment 3 is characterized in that terminals for the newly added function are formed from the side rail portion 15 provided on the third-side side of the lead frame. Other configurations and manufacturing steps are the same as Embodiment 1, and description thereof is omitted here.

Figure 14:
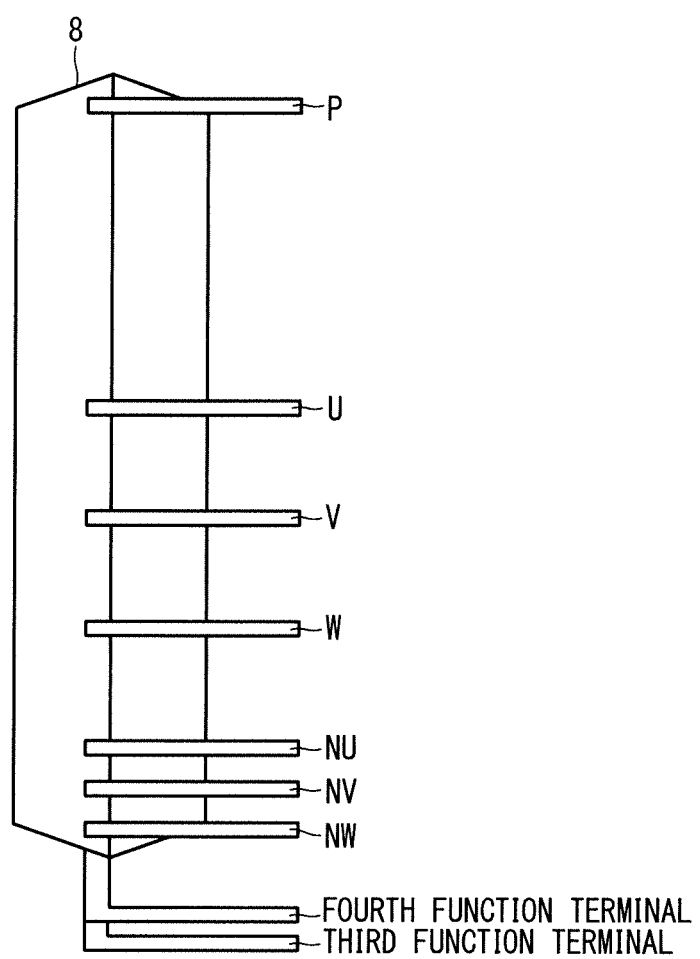
FIG. 14 is a side view illustrating the appearance example of the semiconductor device according to Embodiment 3.

FIG. 13 is a plan view illustrating an appearance example of the semiconductor device according to Embodiment 3. FIG. 14 is a side view illustrating the appearance example of the semiconductor device according to Embodiment 3.

As illustrated in FIG. 13, a third function terminal and a fourth function terminal (third-side side rail terminals) are formed from the side rail portion 15 (third-side side rail portion). Further, the existing terminals including the first function terminal and the second function terminal are provided on the second-side side of the lead frame 14.

As described above, according to Embodiment 3, the terminals for the newly added function are formed from the side rail portion provided on the third-side side of the lead frame; therefore, installation of new function to the semiconductor device is ensured without changing the size (product size) of the completed semiconductor device.

Further, due to no change in the size of the lead frame and no reduction in the number of semiconductor devices that can be provided in one lead frame, the prevention of the increase in the manufacturing cost of the semiconductor device is ensured.

In the above description, although the configuration in which the third function terminal and the fourth function terminal are formed in the side rail portion 15 of the lead frame 14 has been described, the present invention is not limited thereto. An arbitrary types and the number of terminals formed in the side rail portion 15 and an arbitrary bending direction of the terminals may also be adopted. Further, the terminals may be formed from the side rail portion 16 instead of the side rail portion 15. In this case, the third terminal and the fourth terminal may be formed from the side rail portion 16, for example.

Embodiment 4

In Embodiment 3, the configuration in which the terminals for the newly added function are formed in the side rail portion 15 of the lead frame 14 has been described. Embodiment 4 is characterized in that terminals for a newly added function are also formed in the side rail portion 16 of the lead frame 14. Other configurations and manufacturing steps are the same as Embodiment 3, and description thereof is omitted here.

Figure 15:
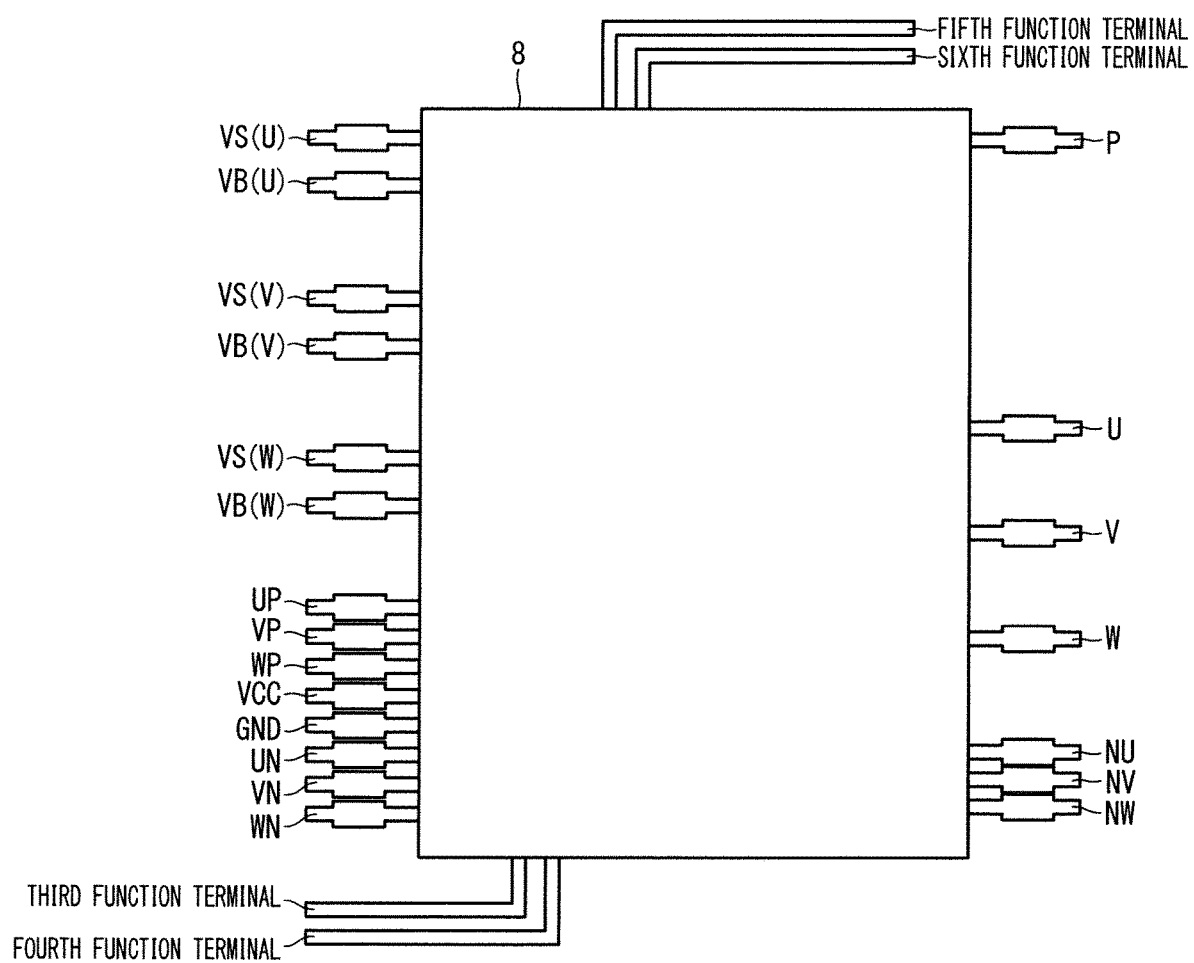
FIG. 15 is a plan view illustrating an appearance example of a semiconductor device according to Embodiment 4.
Figure 16:
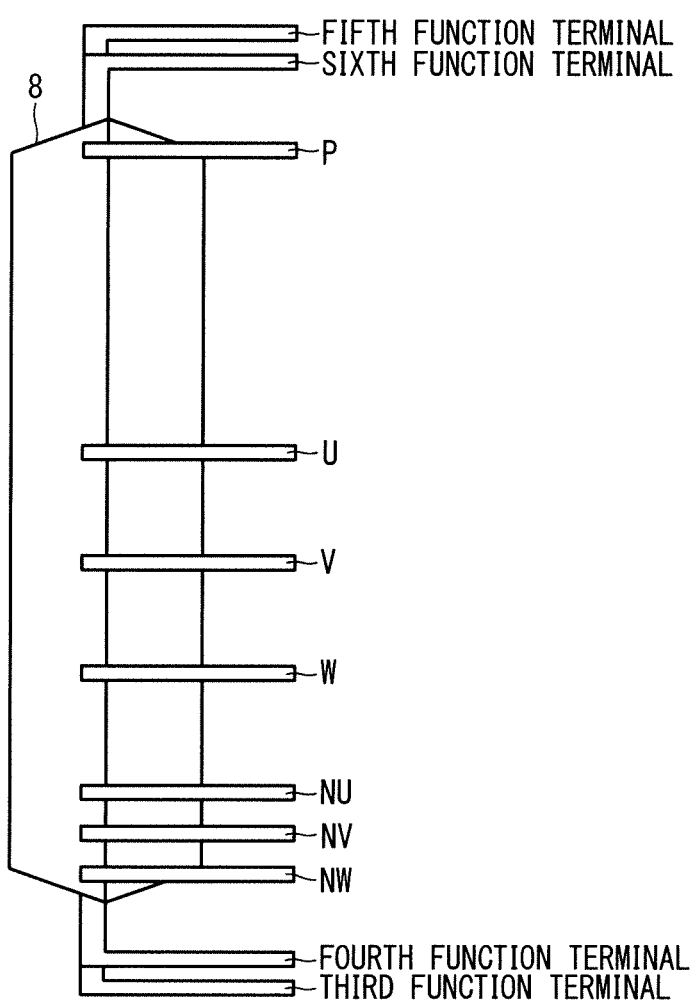
FIG. 16 is a side view illustrating the appearance example of the semiconductor device according to Embodiment 4.

FIG. 15 is a plan view illustrating an appearance example of a semiconductor device according to Embodiment 4. FIG. 16 is a side view illustrating the appearance example of the semiconductor device according to Embodiment 4.

As illustrated in FIG. 15, the third function terminal and the fourth function terminal (third-side side rail terminals) being terminals for the newly added function are formed from the side rail portion 15 (third-side side rail portion). Further, a fifth function terminal and a sixth function terminal (fourth-side side rail terminals) being terminals for a newly added function are formed from the side rail portion 16 (fourth-side side rail portion). Further, the existing terminals including the first function terminal and the second function terminal are provided on the second-side side of the lead frame 14.

As described above, according to Embodiment 4, the terminals for the newly added function are formed from the side rail portion provided on each of the third-side side and the fourth-side side of the lead frame. Therefore, the number of newly added functions can be increased as compared with Embodiment 3 without increasing the manufacturing cost.

In the above description, although the configuration in which the third function terminal and the fourth function terminal are formed in the side rail portion 15 of the lead frame 14 and the fifth function terminal and the sixth function terminal are formed in the side rail portion 16 of the lead frame 14 has been described, the present invention is not limited thereto. An arbitrary types and the number of terminals formed in the side rail portion 15 and the side rail portion 16 and an arbitrary bending direction of the terminals may also be adopted.

Embodiment 5

Figure 17:
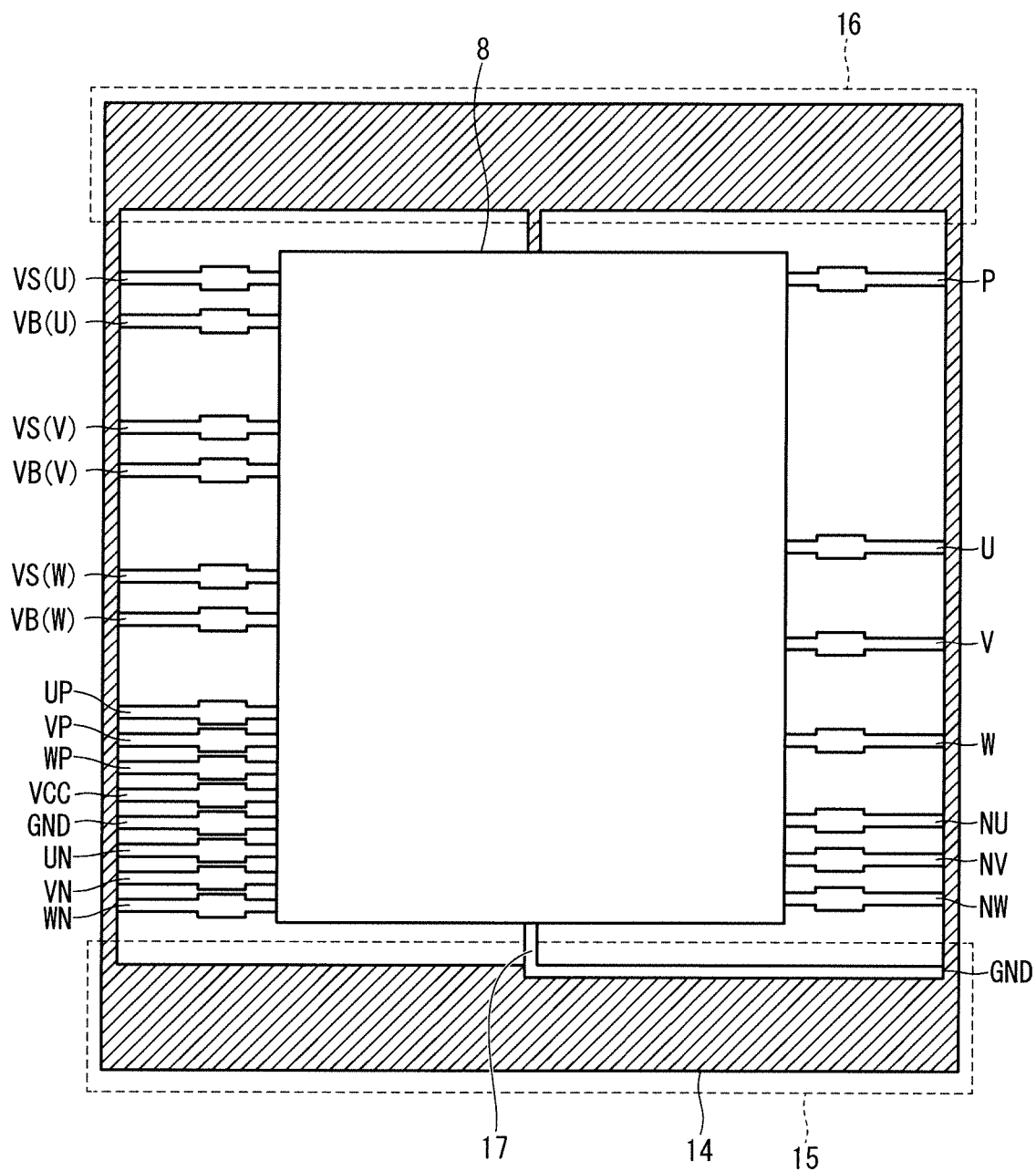
FIG. 17 is a plan view illustrating an example of a manufacturing step of a semiconductor device according to Embodiment 5.
Figure 19:
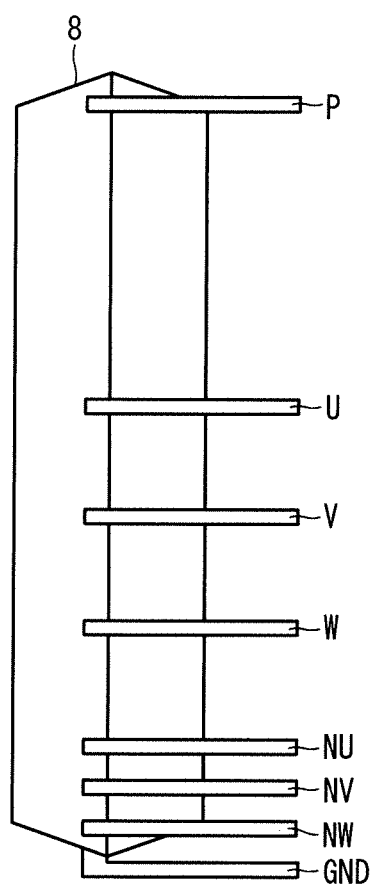
FIG. 19 is a side view illustrating the appearance example of the semiconductor device according to Embodiment 5.

FIG. 17 is a plan view illustrating an example of a manufacturing step of a semiconductor device according to Embodiment 5, and illustrates the semiconductor device after the tie bar cutting step of Step S6 illustrated in FIG. 6. FIG. 18 is a plan view illustrating an appearance example of the semiconductor device according to Embodiment 5. FIG. 19 is a side view illustrating the appearance example of the semiconductor device according to Embodiment 5.

In the lead cutting step of Step S7 illustrated in FIG. 6, the outer peripheral portion of the lead frame 14 (the hatched portion in FIG. 17) is cut and removed. As a result, a GND terminal extending toward the first-side side where the power side terminals 4 are provided is formed from a suspension portion 17 connecting the side rail portion 15 (third-side side rail portion) of the lead frame 14 and the IC die pad 13. That is, the GND terminal is composed of the suspension portion 17 and a portion cut out from the side rail portion 15, and its orientation is the same as that of the power side terminals 4.

Figure 20:
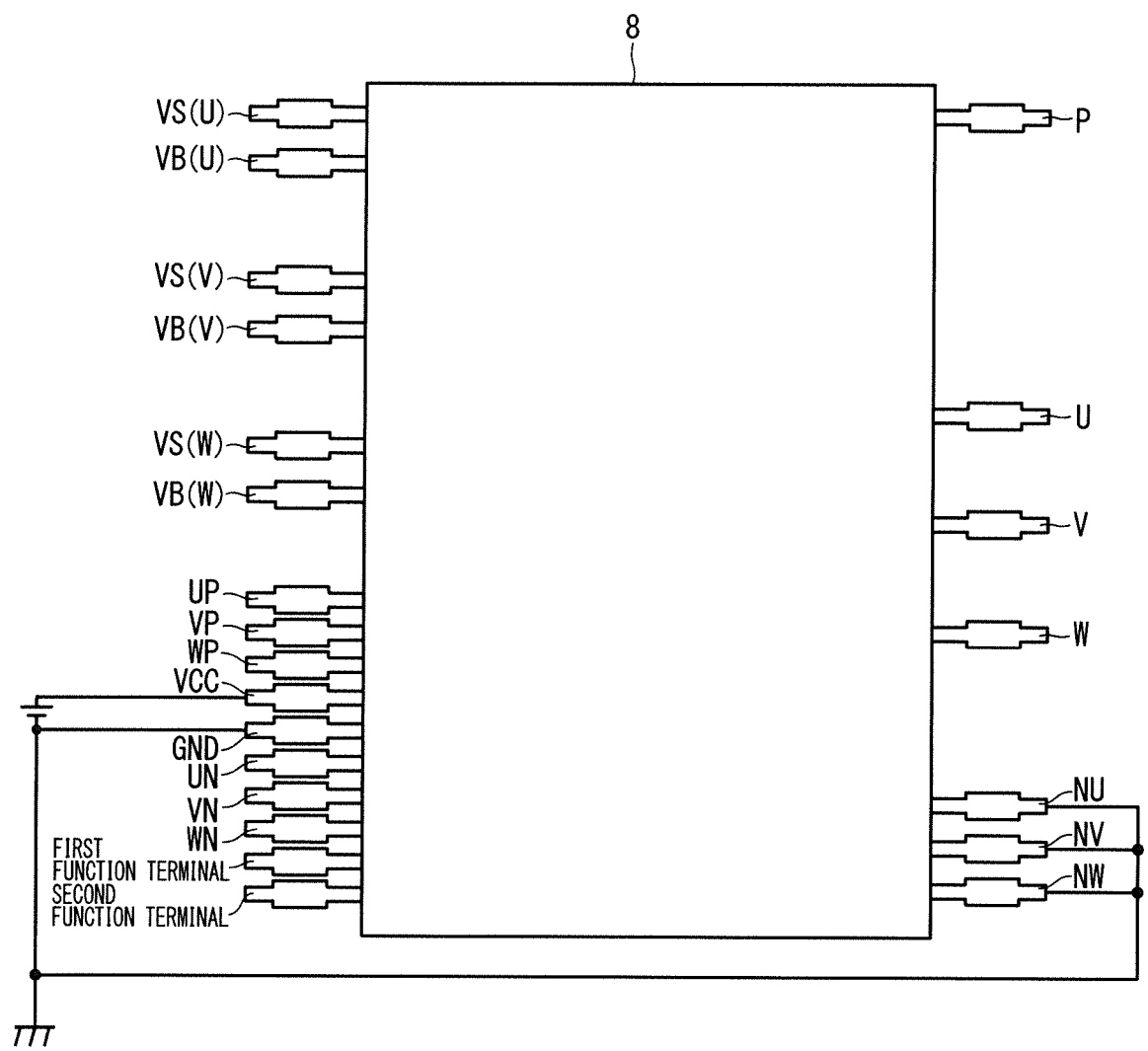
FIG. 20 is a diagram for illustrating the effect of the semiconductor device according to Embodiment 5.
Figure 21:
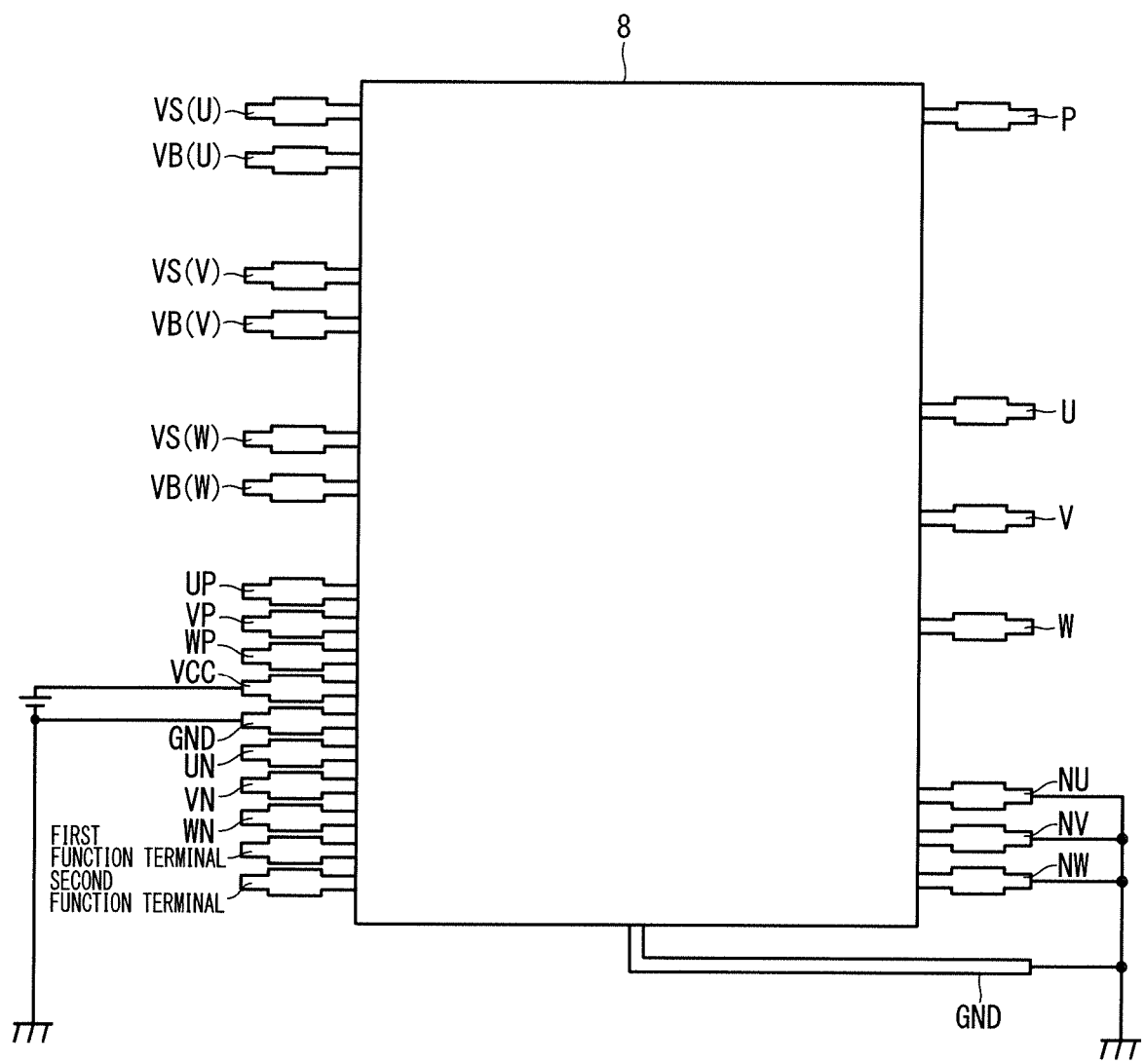
FIG. 21 is a diagram for illustrating the effect of the semiconductor device according to Embodiment 5.

From the above, according to Embodiment 5, the GND terminal is arranged at a position close to the NU terminal, the NV terminal, and the NW terminal. In the configuration in which the existing GND terminal is connected to the NU terminal, the NV terminal, and the NW terminal (FIG. 20), the wiring length connecting the NU terminal, the NV terminal, and the NW terminal and the GND terminal becomes long, causing an increase in inductance and an increase in surge voltage. On the other hand, according to the configuration of Embodiment 5 illustrated in FIG. 21, shortening of the wiring length connecting the NU terminal, the NV terminal, and the NW terminal and the GND terminal is ensured while maintaining the size of the semiconductor device, which prevents the increase in inductance and suppresses the increase in surge voltage.

The semiconductor device according to Embodiment 5 is not limited to the configuration described above, and a configuration that is arbitrarily combined with the configurations described in Embodiments 1 to 4 may also be adopted.

Embodiment 6

Embodiment 6 is characterized in that the power chips 5 and the freewheel diodes 6 included in the semiconductor device according to Embodiments 1 to 5 are composed of a wide bandgap semiconductor. Here, examples of the wide bandgap semiconductor include SiC and GaN. Other configurations and manufacturing steps of the semiconductor device are the same as any of Embodiments 1 to 5, and description thereof is omitted here.

The power chips 5 and the freewheel diodes 6 made of the wide bandgap semiconductor have high breakdown voltage resistance and high allowable current density; therefore, miniaturization of the power chips 5 and the freewheel diodes 6 is ensured. Therefore, the miniaturization of the semiconductor device including the miniaturized power chips 5 and the freewheel diodes 6 is ensured.

The power chips 5 and the freewheel diodes 6 composed of the wide bandgap semiconductor have high heat resistance; therefore, the heat dissipation fins of the heat sink can be miniaturized.

The power chips 5 and the freewheel diodes 6 made of the wide bandgap semiconductor have low power loss; therefore, the efficiency of the power chips 5 and the freewheel diodes 6 is enhanced, which in turn enhances the efficiency of semiconductor devices.

Although, it is desirable that both the power chips 5 and the freewheel diodes 6 are composed of a wide bandgap semiconductor, either one of the power chips 5 and the freewheel diodes 6 may be composed of a wide bandgap semiconductor. In this case as well, the same effect as described above can be obtained.

It should be noted that Embodiments can be arbitrarily combined and can be appropriately modified or omitted without departing from the scope of the present disclosure.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
a lead frame including a switching element die pad connected to a power side terminal arranged on a side of a first side in plan view, a control element die pad connected to a control side terminal arranged on a side of a second side opposite to the first side, and a third-side side rail portion provided on a side of a third side different from the first side and the second side;
a switching element and a diode element placed on the switching element die pad;
a control element placed on the control element die pad and configured to control the switching element; and
a mold resin for sealing the switching element, the diode element, and the control element such that the power side terminal, the control side terminal, and a third-side side rail terminal protrude outward, the third-side side rail terminal being a part of the third-side side rail portion.

2. The semiconductor device according to claim 1, wherein
the lead frame includes a fourth-side side rail portion on a side of a fourth side opposite to the third side, and
a fourth-side side rail terminal being a part of the fourth-side side rail portion protrudes outward from the mold resin.

3. The semiconductor device according to claim 2, wherein
the third-side side rail terminal and the fourth-side side rail terminal are not opposite to each other.

4. The semiconductor device according to claim 1, wherein
the third-side side rail terminal is a terminal formed for a newly added function.

5. The semiconductor device according to claim 2, wherein
the fourth-side side rail terminal is a terminal formed for a newly added function.

6. The semiconductor device according to claim 1, wherein
the lead frame includes an IC die pad on which an IC is placed and a suspension portion connecting the IC die pad and the third-side side rail portion, and
a GND terminal including the suspension portion protrudes from a side of the third side of the mold resin and extends toward a side of the first side.

7. The semiconductor device according to claim 1, wherein
at least one of the switching element and the diode element is composed of a wide bandgap semiconductor.

* * * * *